United States Patent
Otsuka et al.

(12)
(10) Patent No.: US 6,180,513 B1
(45) Date of Patent: *Jan. 30, 2001

(54) APPARATUS AND METHOD FOR MANUFACTURING A SEMICONDUCTOR DEVICE HAVING A MULTI-WIRING LAYER STRUCTURE

(75) Inventors: Mari Otsuka; Kenichi Otsuka, both of Kawaski (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/910,007

(22) Filed: Aug. 12, 1997

(30) Foreign Application Priority Data

Aug. 13, 1996 (JP) .................................... 8-213709

(51) Int. Cl.[7] .................................. H01L 21/4763
(52) U.S. Cl. .................. 438/630; 438/622; 438/643; 438/653; 438/683
(58) Field of Search ...................... 438/641, 628, 438/653, 649, 627, 630, 675, 683, 643, 674, 597, 622; 148/DIG. 19, DIG. 20

(56) References Cited

U.S. PATENT DOCUMENTS

| 4,851,369 | * | 7/1989 | Ellwanger et al. | 438/649 |
|---|---|---|---|---|
| 4,897,709 | * | 1/1990 | Yokoyama et al. | 438/653 |
| 4,902,645 | * | 2/1990 | Ohba | 148/DIG. 19 |
| 5,071,789 | * | 12/1991 | Nakata | 438/641 |
| 5,254,498 | * | 10/1993 | Sumi | 438/653 |
| 5,407,861 | * | 4/1995 | Maragon et al. | 438/628 |
| 5,430,328 | * | 7/1995 | Hsue | 438/653 |
| 5,478,780 | * | 12/1995 | Koerner et al. | 438/653 |

* cited by examiner

Primary Examiner—Carl Whitehead, Jr.
Assistant Examiner—Maria Guerrero
(74) Attorney, Agent, or Firm—Finnegan, Henderson, Farabow, Garrett & Dunner, L.L.P.

(57) ABSTRACT

Disclosed are an apparatus and a method for manufacturing a semiconductor device. A Si wafer set within an L/UL chamber is transferred under the state of a high vacuum through a transfer chamber into a Ti chamber. The wafer is heated to at least 300° C. within the Ti chamber by a heating mechanism arranged within the Ti chamber. Then, a $TiSi_x$ film is formed at a bottom portion of a contact hole by a plasma CVD method using an Ar gas supplied through a gas line as a carrier gas and a $TiCl_4$ gas supplied through another gas line as a source gas, Ti in the source gas being self-aligned with Si in the wafer. The wafer having the $TiSi_x$ film formed therein is transferred through the transfer chamber into a W chamber without being exposed to the air atmosphere. Within the W chamber, a W film is consecutively deposited by a selective CVD method on the $TiSi_x$ film. The particular technique makes it possible to form the $TiSi_x$ film of a high quality at a bottom portion of the contact hole even if the contact hole has a large aspect ratio.

16 Claims, 4 Drawing Sheets

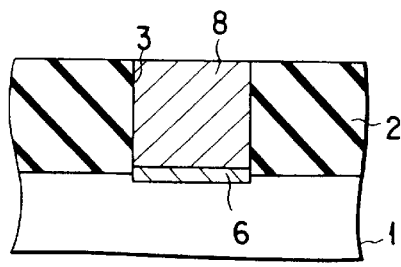
FIG. 1E
PRIOR ART
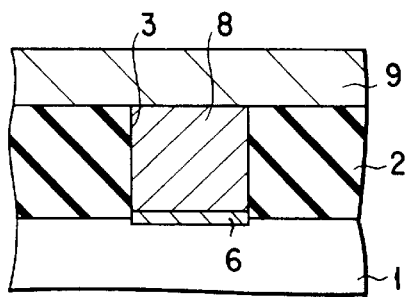
FIG. 1F
PRIOR ART
- Ti/TiN SPUTTERING
- ANNEALING (SILICIDATION)
- PEELING (Ti/TiN)
- REMOVAL (SiO₂)
- W SELECTIVE CVD
FIG. 2
PRIOR ART

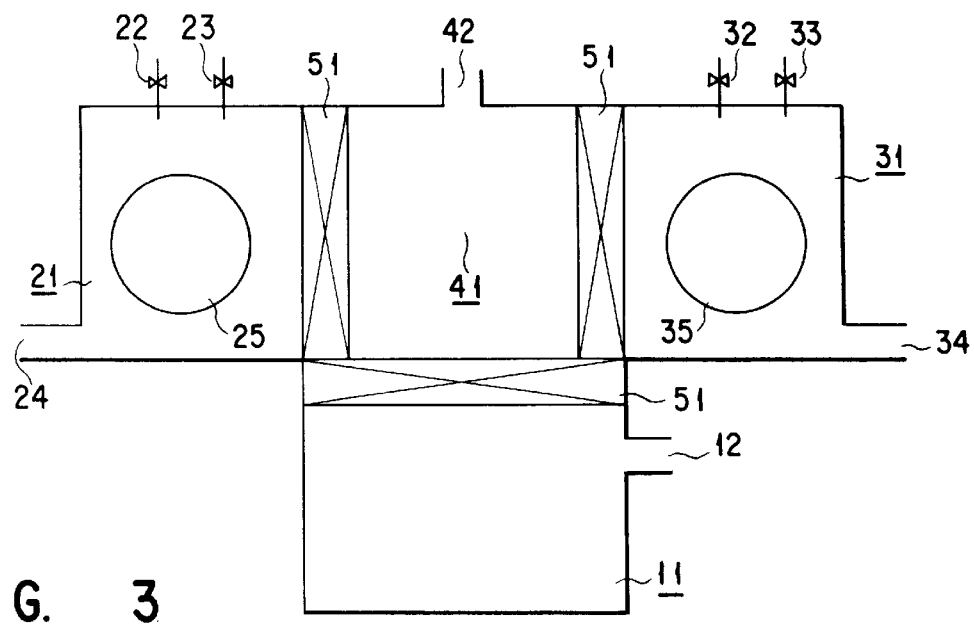
FIG. 3
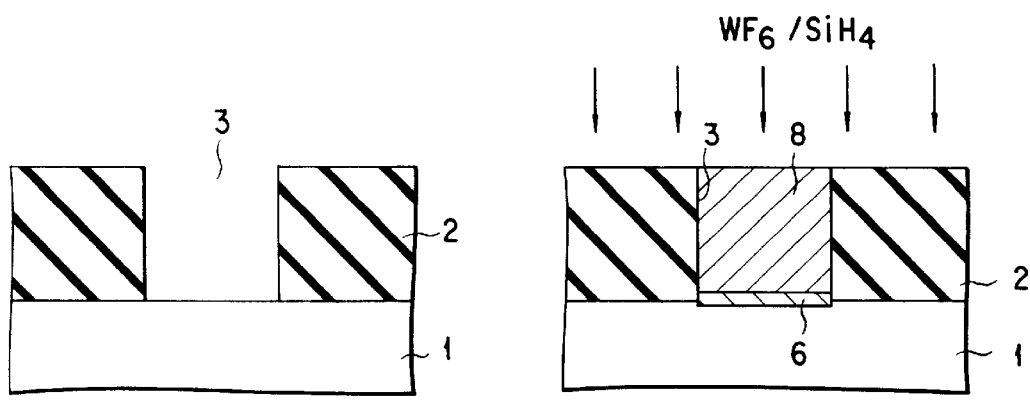
FIG. 4A
FIG. 4B
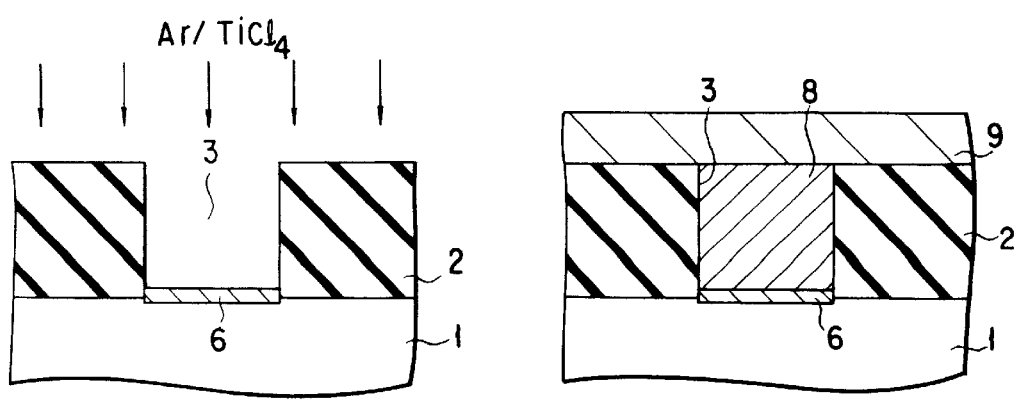
FIG. 4C
FIG. 4D

○———○ TiSi$_x$ PLASMA CVD
○———○ W SELECTIVE
FIG. 5
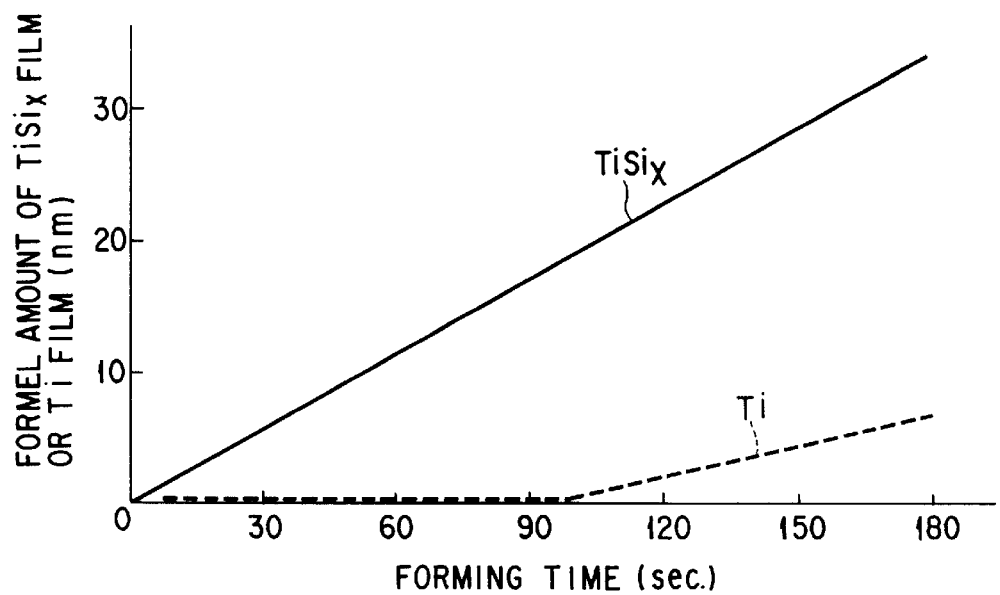
FIG. 6
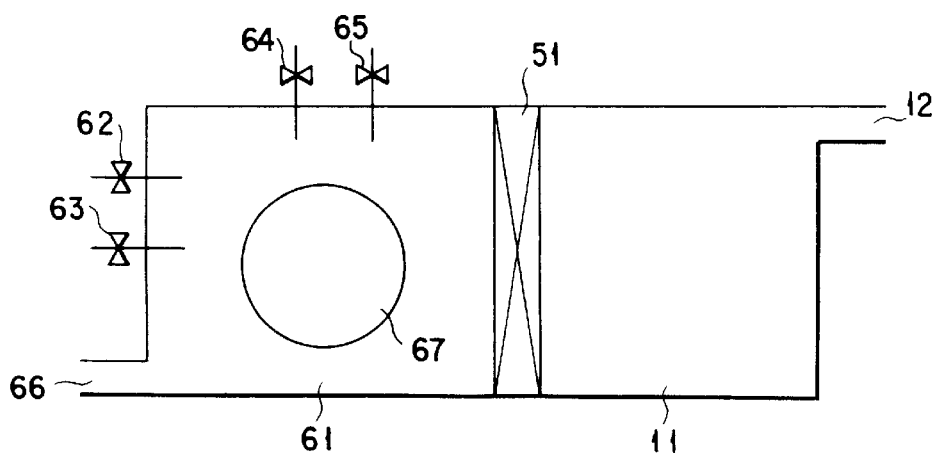
FIG. 7

APPARATUS AND METHOD FOR MANUFACTURING A SEMICONDUCTOR DEVICE HAVING A MULTI-WIRING LAYER STRUCTURE

BACKGROUND OF THE INVENTION

The present invention relates to an apparatus and method for manufacturing a semiconductor device, particularly, to a pretreatment in preparation for a selective CVD (Chemical Vapor Deposition) treatment for burying W (tungsten) in a contact hole to achieve an electrical connection between a silicon wafer and a conductive layer formed above the wafer surface.

In the manufacture of a semiconductor device having a multi-wiring layer structure, a conductive plug material, e.g., W, is buried in general in a contact hole such as a via-hole connecting upper and lower wiring layers so as to improve the reliability of the upper wiring layer made of, for example, aluminum. On the other hand, where W is buried by selective CVD in a contact hole for electrically connecting a first conductive layer, such as a diffusion region formed in a semiconductor substrate, e.g. a Si layer, to a second conductive layer formed above the first conductive layer, it is necessary to form a barrier metal layer on the surface of the first conductive layer (or bottom of the contact hole) in order to prevent the buried W layer from biting the Si layer.

FIGS. 1A to 1F are cross sectional views collectively showing schematically the conventional selective CVD method for burying W in a contact hole. On the other hand, FIG. 2 a flow chart schematically showing the flow of the required treatments. In the first step, a contact hole 3 is formed in an insulating film 2 formed to cover the surface of a silicon wafer 1, as shown in FIG. 1A. Then, a titanium (Ti) film 4 and a titanium nitride (TiN) film 5 are formed successively by a sputtering method on the entire surface including the contact hole 3, as shown in FIG. 1B. The TiN film 5 acts as a cap material serving to prevent the Ti film 4 from being nitrided or oxidized in the subsequent annealing step. Then, annealing is applied under a nitrogen gas atmosphere at 200° C. or higher so as to achieve silicidation at the interface between the silicon wafer 1 and the Ti film 4. As a result, a barrier metal layer 6 made of $TiSi_x$ is formed at the bottom region of the contact hole 3, as shown in FIG. 1C.

After formation of the $TiSi_x$ film 6, the excess Ti film 4 and TiN film 5, which were not involved in the above-noted silicidation, are removed. In the subsequent step, a native oxide ($SiO_2$) film 7 formed on the surface of the $TiSi_x$ film 6 as shown in FIG. 1D is removed as a pretreatment in preparation for the selective CVD treatment for burying W in the contact hole 3. Then, a W film 8 is buried in the contact hole 3 by the selective CVD treatment such that the W film 8 is in direct contact with the $TiSi_x$ film 6 having the native oxide film 7 removed from the surface, as shown in FIG. 1E. Finally, a second conductive layer 9 acting as an upper wiring layer is formed on the entire surface, as shown in FIG. 1F, thereby to achieve a multi-wiring structure in which the silicon wafer (first conductive layer) 1 is electrically connected to the second conductive layer 9 via the W film 8 filling the contact hole 3.

In the conventional method, however, it is necessary to remove the excess Ti film 4 and the TiN film 5 after formation of the $TiSi_x$ film 6, as shown in FIG. 2. What should also be noted is that the $TiSi_x$ film 6 soon after formation is exposed to the air atmosphere before the selective CVD treatment for burying W in the contact hole 3, with the result that the native oxide film 7 is formed on the surface of the $TiSi_x$ film 6. Naturally, it is absolutely necessary to remove the native oxide film 7 before deposition of the W film 8. Further, a sputtering method is employed for forming the Ti film 4 and the TiN film 5. It should be noted in this connection that, where the contact hole 3 has a high aspect ratio, i.e., a ratio of the height to the diameter, the sputtered particles fail to reach sufficiently the bottom of the contact hole 3, resulting in failure to form a $TiSi_x$ film of a high quality.

BRIEF SUMMARY OF THE INVENTION

As described above, a large number of treating steps are required in the conventional method for forming a $TiSi_x$ film. Also, the conventional method necessitates a pretreatment for removing a native oxide film. Further, it is difficult to form a $TiSi_x$ film of a high quality where the film is formed within a contact hole having a high aspect ratio.

A first object of the present invention is to provide an apparatus and method for manufacturing a semiconductor device, which permit markedly decreasing the number of treating steps required for forming a barrier metal layer and also permit forming a high quality barrier metal layer efficiently even if the barrier metal layer is formed within a contact hole having a high aspect ratio.

A second object of the present invention is to provide a method and apparatus for manufacturing a semiconductor device, which permit decreasing the number of treating steps and also permit markedly simplifying the construction of the apparatus.

According to a first aspect of the present invention, there is provided an apparatus for manufacturing a semiconductor device, comprising means for forming a barrier metal layer in a bottom portion of a contact hole made through an insulating film formed on a first conductive layer, the barrier metal layer being formed before burying in the contact hole a conductive material layer connected to a second conductive layer and being formed by a plasma CVD method using, as a source gas, a gas containing a substance capable of self-alignment with the first conductive layer.

According to a second aspect of the present invention, there is provided an apparatus for manufacturing a semiconductor device, comprising:

means for forming a barrier metal layer at a bottom portion of a contact hole formed through an insulating film for insulation between a first conductive layer and a second conductive layer, the barrier metal layer being formed before burying a conductive material in the contact hole and being formed by a plasma CVD method using, as a source gas, a gas containing a substance capable of self-alignment with the first conductive layer; and means for consecutively forming a film of the conductive material by a selective CVD method on the barrier metal layer formed in the bottom portion of the contact hole.

According to a third aspect of the present invention, there is provided a method of manufacturing a semiconductor device, comprising the step of forming a barrier metal layer in a bottom portion of a contact hole made through an insulating film formed on a first conductive layer, the barrier metal layer being formed before burying in the contact hole a conductive material layer connected to a second conductive layer and being formed by a plasma CVD method using, as a source gas, a gas containing a substance capable of self-alignment with the first conductive layer.

Further, according to a fourth aspect of the present invention, there is provided a method of manufacturing a semiconductor device, comprising the steps of:

forming a barrier metal layer at a bottom portion of a contact hole formed through an insulating film for insulation between a first conductive layer and a second conductive layer, the barrier metal layer being formed before burying in the contact hole a conductive material and being formed by a plasma CVD method using, as a source gas, a gas containing a substance capable of self-alignment with the first conductive layer; and consecutively forming a film of the conductive material by a selective CVD method on the barrier metal layer formed in the bottom portion of the contact hole.

The apparatus and method of the present invention permit forming a barrier metal layer by self-alignment with a first conductive layer. As a result, formation of the barrier metal layer can be simplified. In addition, the barrier metal layer can be formed in a bottom portion of a contact hole without fail regardless of the aspect ratio of the contact hole. Further, a conductive material can be buried in the contact hole immediately after formation of the barrier metal layer. In other words, the barrier metal layer is not exposed to the air atmosphere before the step of burying the conductive material in the contact hole. It follows that it is unnecessary to employ a pretreatment for removing a native oxide film before the step of burying a conductive material in the contact hole.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1F are cross sectional views collectively showing a conventional method of burying a conductive material in a contact hole;

FIG. 2 is a flow chart showing the flow of treatments in the conventional method shown in FIG. 1;

FIG. 3 schematically shows the construction of an apparatus for manufacturing a semiconductor device according to one embodiment of the present invention;

FIGS. 4A to 4D are cross sectional views collectively showing a method of the present invention for manufacturing a semiconductor device;

FIG. 5 is a flow chart showing the flow of the treating steps included in the method shown in FIG. 4;

FIG. 6 schematically shows the relationship between the forming time and the thickness of each of a $TiSi_x$ film and a Ti film; and FIG. 7 schematically shows the construction of an apparatus for manufacturing a semiconductor device according to another embodiment of the present invention.

DETAILED DESCRIPTION OF THE INVENTION

Figure 1A:
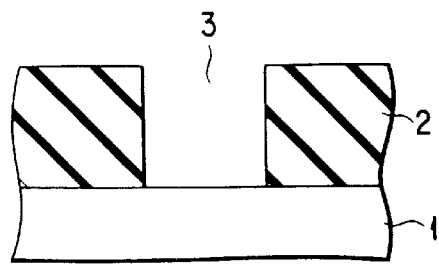
Figure 1B:
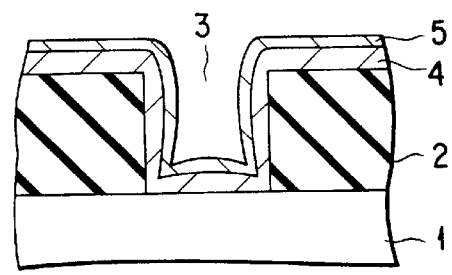
Figure 1C:
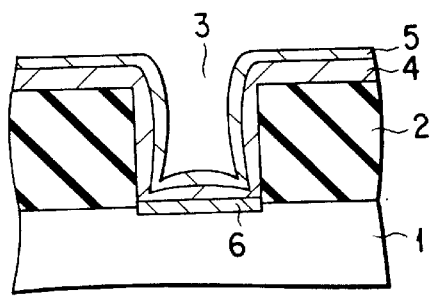
Figure 1D:
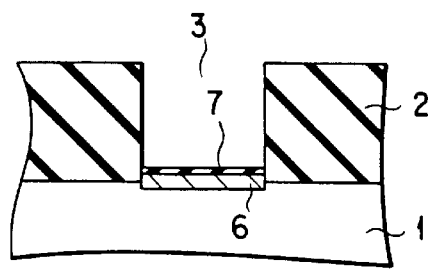

Let us describe some embodiments of the present invention with reference to the accompanying drawings.

Specifically, FIG. 3 schematically shows the construction of an apparatus for manufacturing a semiconductor device. As shown in the drawing, the apparatus comprises an L/UL chamber 11 for loading/unloading silicon wafers, a Ti chamber 21 for forming a $TiSi_x$ film acting as a barrier layer in a bottom portion of a contact hole formed through an insulating film covering the surface of the silicon wafer, and a W chamber 31 for burying a plug material of tungsten (conductive material) in the contact hole in direct contact with the $TiSi_x$ film. These Ti chamber 21 and W chamber 31 are connected to each other via a transfer chamber 41. Further, a valve 51 for maintaining a high vacuum within the L/UL chamber 11 is arranged between the L/UL chamber 11 and the transfer chamber 41. Likewise, other valves 51 are arranged between the Ti chamber 21 and the transfer chamber 41 and between the W chamber 31 and the transfer chamber 41, respectively, for maintaining a high vacuum within each of these Ti chamber 21 and W chamber 31. Further, an exhaust port 12 is formed in the L/UL chamber 11.

A plasma CVD treatment is performed within the Ti chamber 21 for forming a $TiSi_x$ film by self-alignment on the surface of a silicon wafer. In the plasma CVD treatment, an inert gas, i.e., Ar gas, is used as a carrier gas, and a $TiCl_4$ gas containing Ti is used as a source gas. The Ti chamber 21 includes a carrier gas line 22 for supplying the Ar gas, a source gas line 23 for supplying the $TiCl_4$ gas, an exhaust port 24 for releasing the gas remaining within the Ti chamber 21 to the outside, and a heating mechanism 25 for heating the Si wafer to a reaction temperature of at least 300° C. required for forming the $TiSi_x$ film. The heating mechanism 25 can be of any desired type as far as the Si wafer can be heated to 300° C. or higher. For example, it is possible to use an infrared lamp or a hot plate. It is also possible to use an infrared lamp and a hot plate in combination for forming the heating mechanism 25. In the case of employing a hot plate, it is desirable to use an electrostatic chuck or vacuum chuck for holding the Si wafer in order to improve the uniformity of temperature over the entire region of the wafer.

The W chamber 31 is for forming a W film by a selective CVD method on the $TiSi_x$ film positioned within the contact hole. Used for the selective CVD method are a $WF_6$ gas and a $SiH_4$ gas. The W chamber 31 includes a gas line 32 for supplying the $WF_6$ gas, another gas line 33 for supplying the $SiH_4$ gas, an exhaust port 34 for releasing the gases remaining within the W chamber 31 to the outside, and a heating mechanism 35 for heating the Si wafer to temperatures required for depositing the W film, said temperature falling within a range of between room temperature and about 400° C. The heating mechanism 35 can be of any desired type as far as it is possible to control the temperature of the Si wafer to fall within a range of between room temperature and about 400° C. For example, an infrared lamp or a hot plate can be used as the heating mechanism 35. Alternatively, an infrared lamp and a hot plate can be used in combination to constitute the heating mechanism 35. In the case of employing a hot plate, it is desirable to use an electrostatic chuck or vacuum chuck for holding the Si wafer in order to improve the uniformity of temperature over the entire region of the wafer.

The Si wafer set in the L/UL chamber 11 is taken into the transfer chamber 41 and, then, transferred into the Ti chamber 21. Also, the Si wafer having a $TiSi_x$ film formed therein in the Ti chamber 21 is received by the transfer chamber 41 and, then, transferred into the W chamber 31. Further, the Si wafer having a W film buried therein within the W chamber 31 is received by the transfer chamber 41 and, then, transferred into the L/UL chamber 11. As seen from the drawing, the transfer chamber 41 includes an exhaust port 42.

The manufacturing apparatus of the construction described above is used for burying the W film 8 in the contact hole 3 as follows. It should be noted that FIGS. 4A to 4D collectively show the steps required for burying the W film 8 in the contact hole 3 as shown in FIG. 4D. In the first step, the Si wafer 1 having the contact hole 3 formed through the insulating film 2 covering the surface as shown in FIG. 4A is set in the L/UL chamber 11 communicating with the air atmosphere. Then, the L/UL chamber 11 is evacuated to a high vacuum substantially equal to that in the transfer chamber 41. Under this condition, the Si wafer 1 set in the L/UL chamber 11 is transferred via the transfer chamber 41 into the Ti chamber 21 and, then, heated to 300° C. or higher by the heating mechanism 25 arranged within the Ti chamber 21. Then, a plasma CVD is applied to the wafer 1 using an Ar gas supplied through the carrier gas line 22 as a carrier gas and a $TiCl_4$ gas supplied through the source gas supply line 23 as a source gas. As a result, the Si in the wafer 1 is self-aligned with the Ti in the $TiCl_4$ gas at the interface of the wafer 1 so as to form the $TiSi_x$ film 6 at the bottom portion of the contact hole 3, as shown in FIG. 4B. Incidentally, the plasma CVD causes Ti precipitation. However, the $TiSi_x$ film of high quality can be obtained by finishing the plasma CVD before the Ti precipitation.

The wafer 1 having the $TiSi_x$ film 6 formed therein is transferred without being exposed to the air atmosphere via the transfer chamber 41 into the W chamber 31. The temperature of the wafer 1 transferred into the W chamber 31 is controlled by the heating mechanism 35 to fall within a range of between room temperature and about 400° C. Under this condition, a selective CVD is performed using a $WF_6$ gas supplied through the gas line 32 and a $SiH_4$ gas supplied through the gas line 33. As a result, W is selectively deposited on the $TiSi_x$ film 6 formed at the bottom portion of the contact hole 3 so as to permit the W film 8 to be buried in the contact hole 3, as shown in FIG. 4C. It should be noted that the wafer 1 after formation of the $TiSi_x$ film 6 is transferred into the W chamber 31 without being exposed to the air atmosphere, as already pointed out. It follows that the W film 8 can be formed immediately after formation of the $TiSi_x$ film 6.

To be more specific, since the $TiSi_x$ film 6 and the W film 8 are consecutively formed within the chambers 21 and 31, respectively, which are maintained at a high vacuum, it is impossible for a native oxide film to be formed on the surface of the $TiSi_x$ film 6. Needless to say, it is unnecessary to employ a process for removing the native oxide film from the surface of the $TiSi_x$ film 6. It is also unnecessary to use an equipment for removing the native oxide film such as an etching device using $BCl_3$ or an annealing device. In addition, since plasma CVD is employed for forming the $TiSi_x$ film 6, the film 6 can be formed in a perfectly desired form regardless of the aspect ratio of the contact hole. In other words, the $TiSi_x$ film 6 of high quality can be formed even if the contact hole has a high aspect ratio.

After deposition of the W film 8, the wafer 1 is transferred via the transfer chamber 41 into the L/UL chamber 11. Then, the L/UL chamber 11 is allowed to communicate with the air atmosphere, and the wafer 1 is taken out of the chamber 11. Further, after deposition of the W film 8 within the contact hole 3, the second conductive layer 9 made of, for example, Al is formed as an upper wiring layer, as shown in FIG. 4D. As apparent from the drawing, the Si wafer 1 is electrically connected to the second conductive layer 9 via the W film 8 filling the contact hole 3 so as to achieve a multi-wiring layer structure.

FIG. 5 schematically shows the flow of the treatments required for depositing the W film 8. As already pointed out, the $TiSi_x$ film 6 is formed by a plasma CVD method in the present invention. As a result, the number of treating steps can be markedly decreased, as apparent from comparison between FIG. 5 and FIG. 2 directed to the conventional method. Specifically, the method of the present invention makes it unnecessary to employ the annealing treatment for silicidation, and the steps for removing the excess Ti film which is not involved in the silicidation and for removing the cap material of the TiN film. Further, the treating steps ranging between formation of the $TiSi_x$ film 6 and deposition of the W film 8 can be performed within a single apparatus while keeping the state of a high vacuum. Naturally, the pretreatment required in the conventional method, i.e., treatment to remove a native oxide film from the surface of the $TiSi_x$ film 6, need not be employed before the step of burying W in the contact hole by a selective CVD method. Needless to say, it is also unnecessary to use an apparatus for removing such a native oxide film.

It should be noted that Ti is also precipitated in the step of forming the $TiSi_x$ film 6 by the plasma CVD method, if the plasma CVD treatment is performed for an unduly long time. FIG. 6 shows the relationship between the thickness of each of the $TiSi_x$ film and the Ti film and the treating time. As apparent from FIG. 6, the $TiSi_x$ film 6 begins to be precipitated immediately after initiation of the plasma CVD treatment. On the other hand, the Ti film begins to be precipitated about 90 seconds after initiation of the plasma CVD treatment. Therefore, the plasma CVD treatment for forming the $TiSi_x$ film 6 is performed for less than 90 seconds in the present invention, making it possible to form the $TiSi_x$ film 6 alone without bringing about precipitation of Ti on the insulating film 2 and on the $TiSi_x$ film 6. In conclusion, the time for the plasma CVD treatment is controlled appropriately in the present invention so as to form very easily the $TiSi_x$ film 6 of high quality.

As described above, the apparatus and method of the present invention make it possible to form a $TiSi_x$ film without fail in a bottom portion of a contact hole regardless of the aspect ratio of the contact hole. To reiterate, a plasma CVD treatment using a $TiCl_4$ gas as a source gas is employed in the present invention. As a result, the self-alignment between Si in the substrate and Ti in the source gas is utilized in the present invention to form a $TiSi_x$ film in a bottom portion of the contact hole. The particular technique permits markedly decreasing the number of treating steps required for forming the $TiSi_x$ film, compared with the conventional method utilizing a sputtering method. In addition, a $TiSi_x$ film of a high quality can be formed in a contact hole, even if the contact hole has a high aspect ratio. Further, the wafer having a $TiSi_x$ film formed therein is transferred into the chamber for subsequently burying a W film in the contact hole. What should be noted is that the wafer is not exposed to the air atmosphere during the transfer into the particular chamber, making it unnecessary to employ the pretreatment required in the conventional method for removing the native oxide film. It follows that the technical idea of the present invention permits markedly simplifying the construction of the apparatus for manufacturing a semiconductor device.

In the embodiment described above, a $TiSi_x$ film and a W film are formed in a single Si wafer in different chambers so as to prevent the reactant gases for the CVD treatments from being mixed together. However, it is also possible to construct the apparatus such that the TiSi$_x$ film and the W film can be formed within the same chamber.

FIG. 7 schematically shows the construction of an apparatus for manufacturing a semiconductor device according to another embodiment of the present invention. As apparent from the drawing, the apparatus comprises a Ti/W chamber 61 for successively forming the TiSi$_x$ film 6 and the W film 8 in addition to the L/UL chamber 11 for loading/unloading the Si wafer 1 and the valve 51 for keeping a high vacuum within each of the Ti/W chamber 61 and the L/UL chamber 11. Needless to say, the Ti/W chamber 61 performs the function of the Ti chamber for forming the TiSi$_x$ film 6 at a bottom portion of the contact hole 3 formed through the insulating film 2 covering the wafer 1 and the function of the W chamber for forming the W film on the TiSi$_x$ film 6.

Connected to the Ti/W chamber 61 are a carrier gas line 62 for supplying a carrier gas such as an Ar gas into the chamber 61, source gas lines 63, 64 and 65 for supplying a TiCl$_4$ gas, a WF gas, and a SiH$_4$ gas, respectively, into the chamber 61, and an exhaust port 66 for discharging the gases remaining within the chamber 61 to the outside. Further, a heating mechanism 67 is arranged within the Ti/W chamber 61 for heating the wafer to temperatures required for forming the TiSi$_x$ film 6, i.e., 300° C. or higher, and for forming the W film 8, i.e., room temperature to about 400° C. The heating mechanism 67 can be of any desired type as far as it is possible to control the temperature of the Si wafer to meet the requirements given above. For example, an infrared lamp or a hot plate can be used as the heating mechanism 67. Alternatively, an infrared lamp and a hot plate can be used in combination to constitute the heating mechanism 67. In the case of employing a hot plate, it is desirable to use an electrostatic chuck or vacuum chuck for holding the Si wafer in order to improve the uniformity of temperature over the entire region of the wafer. Of course, the apparatus shown in FIG. 7 produces prominent effects similar to those produced by the apparatus shown in FIG. 3. In addition, the apparatus shown in FIG. 7 is very compact, compared with the apparatus shown in FIG. 3.

Each of the embodiments described above is directed to formation of a conductive layer within a contact hole. However, the technical idea of the present invention can also be used for forming a conductive layer in, for example, a via hole or a through hole so as to achieve an electrical connection between upper and lower wiring layers. Further, the present invention can be worked in various other fashions within the technical scope of the present invention.

As described above in detail, the present invention provides an apparatus and a method for manufacturing a semiconductor device, which permit markedly decreasing the number of process steps for forming a barrier metal layer and also permit efficiently forming a barrier metal layer of a high quality within a contact hole even if the contact hole has a high aspect ratio. Further, the present invention also provides an apparatus and a method for manufacturing a semiconductor device, which permit decreasing the number of manufacturing steps and also permit markedly simplifying the construction of the apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising the steps of:

forming an insulating film on a first conductive layer;

forming a contact hole through said insulating film to expose a portion of said first conductive layer; and forming a barrier metal layer on a bottom portion of said contact hole, which is said exposed portion of said first conductive layer, by a plasma CVD method using a source gas consisting of at least one kind of metal halide gas, or consisting of at least one kind of inert gas and at least one kind of metal halide gas, so as to be grown from and self-aligned with said first conductive layer, wherein a metal component of said metal halide gas is titanium and the step of forming the barrier metal layer finishes forming said barrier metal layer before initiation of titanium precipitation.

2. The method according to claim 1, wherein said first conductive layer contains silicon.

3. The method according to claim 1, wherein said source gas contains a TiCl$_4$ gas.

4. The method according to claim 1, wherein said conductive material layer includes tungsten.

5. The method according to claim 1, wherein said barrier metal includes a TiSi$_x$ film.

6. The method according to claim 1, wherein said Ti precipitation is initiated about 90 seconds after start-up of said plasma CVD method.

7. The method according to claim 1, wherein said step of forming a barrier metal layer includes a step of reacting said source gas with said first conductive layer to form said barrier layer, such that a bottom portion of said barrier layer is embedded in a surface of said first conductive layer.

8. The method according to claim 1, further comprising the steps of:

forming a conductive film by a selective CVD method on said barrier metal layer formed in the bottom portion of said contact hole, consecutively after forming said barrier metal layer without being exposed to an air atmosphere; and forming a second conductive layer said on said insulating film so as to be connected to said conductive film formed in said contact hole.

9. A method for manufacturing a semiconductor device comprising the steps of:

forming an insulating film on a first conductive layer;

forming a contact hole through said insulating film to expose a portion of said first conductive layer;

forming a barrier metal layer in a bottom portion of said contact hole, which is said exposed portion of said first conductive layer, by a plasma CVD method using a source gas consisting of at least one kind of metal halide gas, or consisting of at least one kind of inert gas and at least one kind of metal halide gas, so as to be grown from and self-aligned with said first conductive layer, wherein said step of forming a barrier metal layer includes reacting said source gas with said first conductive layer to form said barrier layer, such that a bottom portion of said barrier layer is embedded in a surface of said conductive layer; wherein a metal component of said metal halide gas is titanium and said step of forming a barrier metal layer finishes forming said barrier metal layer before initiation of titanium precipitation;

forming a conductive film by a selective CVD method on said barrier metal layer formed in the bottom portion of said contact hole, consecutively after forming said barrier metal layer without being exposed to an air atmosphere, and forming a second conductive layer on said insulation film so as to be connected to said conductive film formed in said contact hole.

10. The method according to claim 9, wherein said first conductive layer contains silicon.

11. The method according to claim 9, wherein said source gas contains a $TiCl_4$ gas.

12. The method according to claim 9, wherein said conductive material layer consists of tungsten.

13. The method according to claim 9, wherein said barrier metal includes a $TiSi_x$ film.

14. The method according to claim 9, wherein said Ti precipitation is initiated about 90 seconds after start-up of said plasma CVD method.

15. The method according to claim 9, wherein said step for forming a barrier metal layer and said step of forming a conductive film are performed within a single chamber.

16. The method according to claim 9, wherein said step for forming a barrier metal layer and said step of forming a conductive film are performed within different chambers.

* * * * *